United States Patent [19]

Akram

[11] Patent Number: 4,581,751

[45] Date of Patent: Apr. 8, 1986

[54] REVERSIBLE SHIFT REGISTER

[75] Inventor: M. Faheem Akram, Stanford, Calif.

[73] Assignee: Motorola, Inc., Schaumburg, Ill.

[21] Appl. No.: 656,395

[22] Filed: Oct. 1, 1984

[51] Int. Cl.[4] ............................................. G11C 19/00
[52] U.S. Cl. ........................................ 377/69; 377/81
[58] Field of Search ...................... 377/69, 70, 73, 77,
377/110, 80, 81, 107, 109, 104, 123, 125

[56] References Cited

U.S. PATENT DOCUMENTS

| | | | |
|---|---|---|---|
| 3,051,848 | 8/1962 | Clark | 377/69 |
| 3,067,341 | 12/1962 | Kunzke | 377/69 |
| 3,155,836 | 11/1964 | Hempel | 377/36 |
| 3,348,069 | 10/1967 | Petschauer | 377/69 |

Primary Examiner—John S. Heyman
Assistant Examiner—K. Ohralik
Attorney, Agent, or Firm—Michael D. Bingham

[57] ABSTRACT

A plurality of cascaded RS flip-flops are enabled by gating circuitry coupled between the output of the last RS flip-flop of the cascaded RS flip-flops and the set and reset inputs of the RS flip-flops to enable digital data stored in a preceding or following RS flip-flop to be shifted into an adjacent following or preceding RS flip-flop upon successive occurrences of complementary clocking pulses applied to the gating circuitry.

15 Claims, 4 Drawing Figures

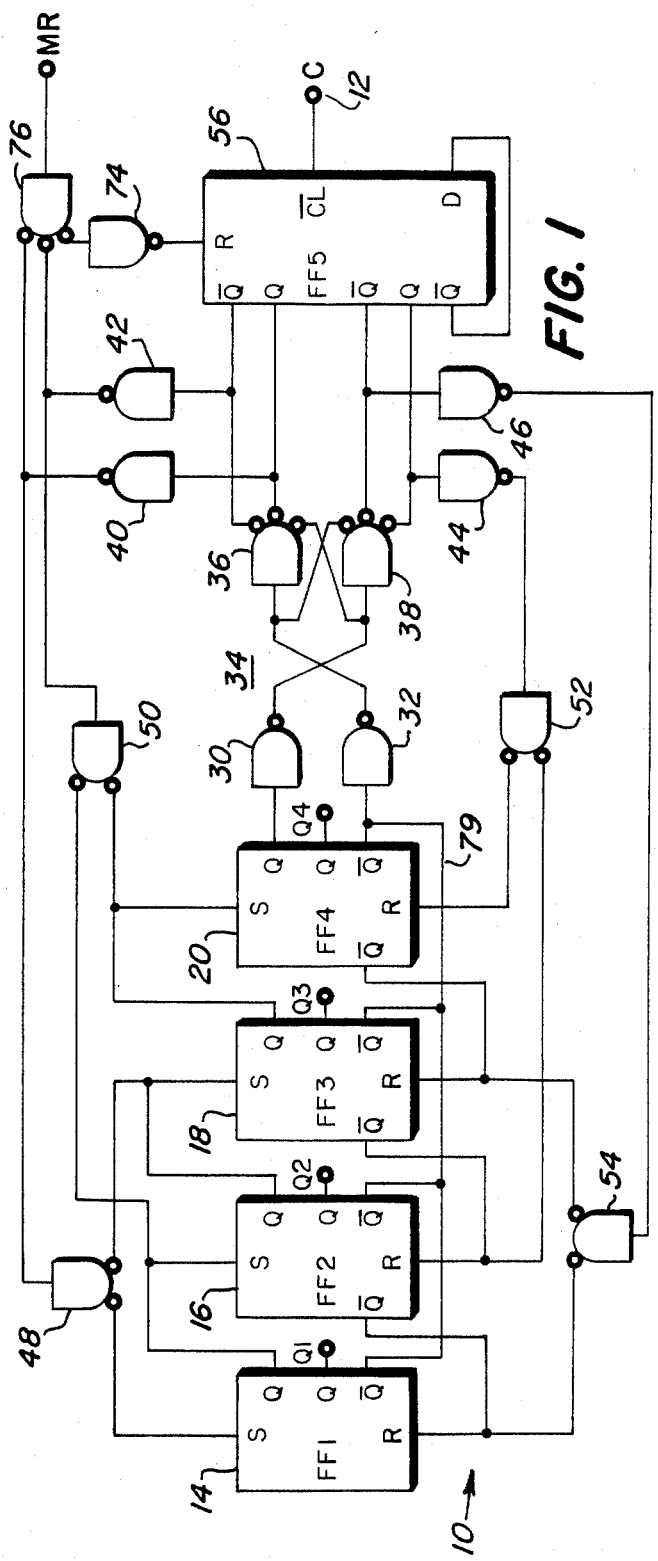
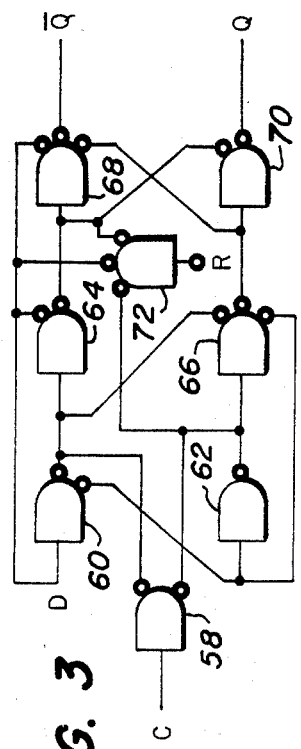
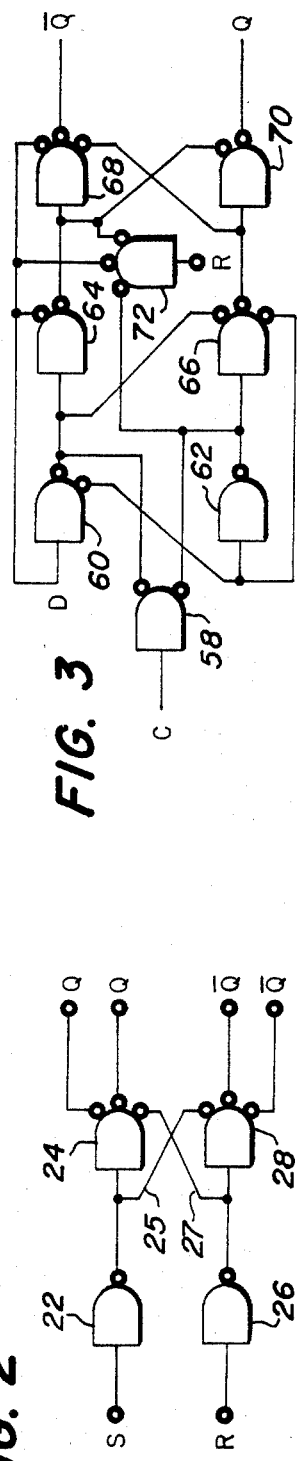
FIG. 1
FIG. 3
FIG. 2

REVERSIBLE SHIFT REGISTER

BACKGROUND OF THE INVENTION

The present invention relates to logic circuits that store digital information on a temporary basis and, more particularly, to shift registers that store and shift a number of binary or decimal digits.

Shift registers for storing and shifting digital data or binary digits as well known in the art and are used in myriad applications. A basic shift register can be comprised of any number of cascaded flip-flops (FF's) which may shift their contents one position to the right upon each occurrence of a clock pulse, i.e., each flip-flop stage switches states once for each clock pulse. By using added gating, the basic shift register can be made to shift digital data to the right until some occurrence happens upon which the data is then shifted to the left. This type of shift register is known as a shift-right shift-left register. Potential applications for such shift registers, among others, are as counters.

For example, a shift-right shift-left register may be utilized in an electronic telephone integrated circuit to generate telephone dial tones from digital generated signals associated with dual-tone multi-frequency (DTMF) dialers as is understood. Typically, shift registers compatible with I2L technology have been used in such electronic telephoneintegrated circuits. These I2L shift registers have been implemented using D flip-flops or J-K flip-flops. D flip-flops and J-K flip-flops require a certain number of gates to function; which for a particular application may be excessive. For instance, a typical I2L D flip-flop requires the use of seven inverter gates (see U.S. Pat. No. 4,085,341). Thus, for an eight stage shift register (eight D flip-flops are required) using a conventional I2L D flip-flop requires 56 gates.

In many integrated circuit applications the function of the circuit is becoming more and more complex which means that more and more circuit components are required. If the number of components required for a particular function can be reduced the die area needed for the integrated circuit is reduced. By reducing die area means, (1) that additional circuit functions can be integrated into the integrated circuit, and (2) fabrication costs are reduced. Hence, if the number of gates required to perform the function of the shift registers can be reduced the aforementioned desired goals can be achieved.

Thus, a need exists for an improved shift register which utilizes fewer component count than is available in the prior art.

SUMMARY OF THE INVENTION

Accordingly, it is an object of the present invention to provide an improved shift register.

It is another object of the present invention to provide an improved shift-right shift-left register.

It is still another object of the present invention to provide an improved shift register that is compatible with I2L technology.

A further object of the present invention is to implement a shift register using set reset flip-flops.

A still further object of the present invention is to provide an improved I2L shift register that is implemented using cascaded RS flip-flop stages.

In accordance with the above and other objects there is provided a shift register which comprises at least first and second RS flip-flops each having a plurality of outputs at which complimentary digital output data are produced wherein one of the outputs of the first RS flip-flop is coupled to the set input of the second RS flip-flop and one of the outputs of a second RS flip-flop is connected to the reset input of the first RS flip-flop and gating circuitry is coupled between the outputs of the second RS flip-flop at which appear two complimentary digital output signals and the set and reset inputs of the first and second RS flip-flops. The control circuitry is responsive to complementary clocking pulses to enable data stored in the first RS flip-flop to be shifted into the second RS flip-flop and vise-versa upon successive clock pulses.

BRIEF DESCRIPTION OF THE DRAWINGS

FIG. 1 is a logic block diagram illustrating the shift register of the preferred embodiment;

FIG. 2 is a logic block diagram illustrating a representative RS flip-flop stage of the shift register of FIG. 1;

FIG. 3 is a logic block diagram illustrating the D flip-flop stage of the shift register of FIG. 1.

DETAILED DESCRIPTION OF THE PREFERRED EMBODIMENT

Figure 4:
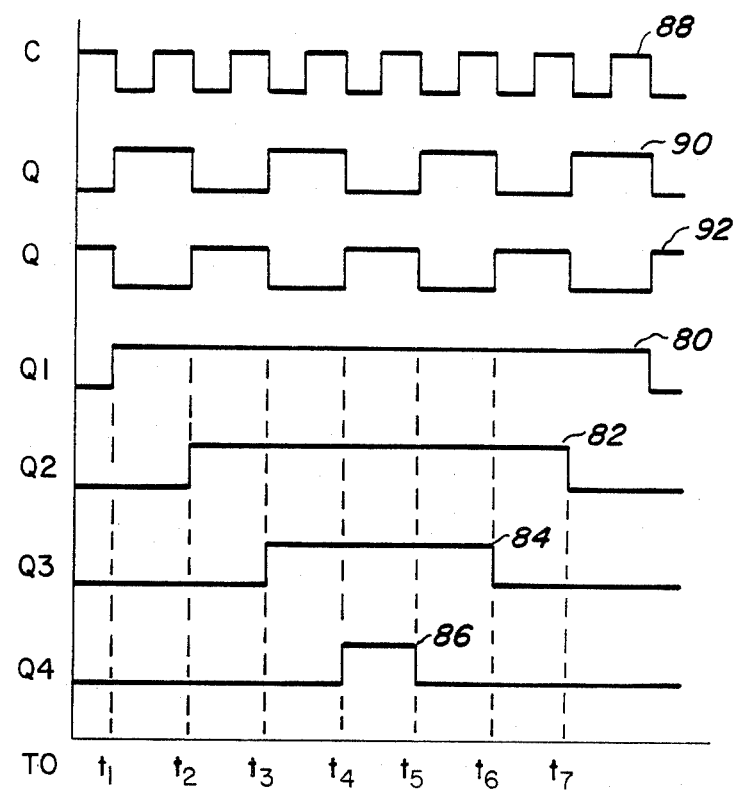
FIG. 4 is a timing diagram useful for understanding the operation of the shift register of the preferred embodiment of the invention.

Turning to FIG. 1, there is illustrated shift register 10 of the present invention which is suited to be fabricated in integrated circuit form and is compatible with present day integrated injection logic (I2L) technology. Shift register 10, as will be later described in detail, is responsive to a clock signal C applied to input terminal 12 for successively enabling the output of a preceding RS flip-flop stage to shift digital data information to the right into a following RS flip-flop stage until all data is shifted to the last RS flip-flop stage and then causing the data information to be shifted to the left through successive RS flip-flop stages until the of all the RS flip-flops are returned to their initial states at which time the information is again shifted to the right. Hence, shift register 10 functions as a shift-right shift-left register.

As illustrated, shift register 10 comprises a plurality of cascaded RS flip-flop stages 14, 16, 18 and 20 which form a four bit counter. It is understood that any number of cascaded flip-flops may be included to provide increased storage capacity. For instance, an eight bit shift register could be realized by cascading four additional RS flip-flop stages in the manner shown in FIG. 1. Each RS flip-flop is identical and is illustrated in FIG. 2 as including four interconnected inverter gates 22, 24, 26 and 28 with the inputs of gates 22 and 26 corresponding to the set and reset inputs respectively of the RS flip-flop. Each inverter gate inverts the logic signal applied thereto, i.e., a logic "0" input is inverted and a logic "1" appears at the output of the inverter gate. The outputs of inverter gates 22 and 26 are coupled to the gates of 24 and 28 the latter of which have their inputs cross-coupled to the others output via leads 25 and 27. Each RS flip-flop of the preferred embodiment provides a plurality of complementary outputs, Q and $\overline{Q}$, with the Q outputs being produced at the output of inverter gate 24 and the complementary output, signal $\overline{Q}$ produced at the outputs of inverter gate 28. The described RS flip-flop is conventional in its structure and is suited for fabrication in I2L technology wherein inverted NPN operated transistors are used as is well understood to those skilled in the art. For purposes of further explanation, it will be assumed that when RS flip-flop stages 14, 16, 18 and 20 are in a reset state the Q outputs thereof are placed in a logic "0" or low state and therefore, the $\overline{Q}$ outputs are in a high or logic "1" state.

RS flip-flops 14, 16, 18 and 20 are connected in cascade with each preceding RS flip-flop having a selected one of its plurality of Q outputs coupled to the set input of the adjacent following RS flip-flop. Similarly, the reset input of each preceding RS flip-flop is coupled to a selected $\overline{Q}$ output from the adjacent following flip-flop stage. A binary coded output signal or digital information is provided from shift register 10 at outputs Q1, Q2, Q3, and Q4 of the respective RS flip-flops 14, 16, 18, and 20. Complementary outputs Q and $\overline{Q}$ of the last RS flip-flop stage 20 are connected respectively to the inputs of inverter gates 30 and 32 of latch gate 34. Latch gate 34 includes inverter gates 36 and 38, the inputs of which are coupled to the outputs of inverter gates 32 and 30 respectively. Each inverter gate 36 and 38 have multiple outputs that correspond to outputs of latch gate 34 with one output of each inverter gate being cross-coupled to the input of the other gate. The remaining outputs of inverter gate 36 are coupled to the inputs of inverter gates 40 and 42 respectively while the remaining outputs of inverter gate 38 are respectfully coupled to the inputs of inverter gates 44 and 46. As will be later described, inverter gates 40 and 42, which are coupled to the respective inputs of inverter gates 48 and 50, and inverter gates 44 and 46 which are similarly coupled to inverter gates 52 and 54 form in conjunction with latch gate 34 control circuitry with the former comprising an upper gating circuit and the latter comprising a lower gating circuit. The control circuitry is illustrated as being coupled between the last RS flip-flop 20 and the set and reset inputs of the cascaded RS flip-flops. The upper and lower gating clock circuits permit shift register 10 to function as a shift-right and shift-left register wherein digital data information will be shifted from the output of a preceding stage or the adjacent following stage depending on the output of latch circuit 34 with each succeeding clocking pulses applied from D flip-flop 56 to the gating circuits.

D flip-flop 56 is conventional in structure and is illustrated in logic diagram form in FIG. 3. As illustrated, inverter gates 58, 60, 62, 64, 66, 68, and 70 are interconnected in a known manner for instance see the aforementioned U.S. Pat. No. '341 which is incorporated herein by reference made thereto. A reset function has been added to the operation of D flip-flop 56 by utilizing inverter gate 72 the multiple outputs of which are coupled to the inputs of inverter gates 60, 66, and 68 and its input coupled to the reset terminal of D flip-flop 56 at which a reset signal may be provided from inverter gate 74. The resetting of D flip-flop 56 in conjunction with a main reset input applied at terminal MR to inverter gate 76 will reset shift register 10.

Referring now to FIGS. 1 and 4 the operation of shift register 10 is explained. To begin, it is assumed that the signal applied at terminal MR in a logic "0" and each RS flip-flop 14, 16, 18 and 20 is in a reset state. With the RS flip-flops being reset, outputs Q1, Q2, Q3 and Q4 will be in a low level or logic "0" state as illustrated by waveforms 80, 82, 84 and 86 (FIG. 4). Hence, the output binary digital signal from shift register 10 is equal to a 0000. With the Q and $\overline{Q}$ outputs of RS flip-flop 20 being low and high respectively, latch gate 34 is latched into a state at which the outputs of inverter gate 36 are high and the outputs of inverter gates 38 are low. As long as the outputs of inverter gate 38 are low, the output of inverter gates 44, 46, 52 and 54 of the lower gate clocking circuit are not disturbed by any transitions of the output states of the Q and $\overline{Q}$ outputs of D flip-flop 56 at which appear complimentary clocking pulses 90 and 92 respectively. Hence, the lower gate clocking circuit is disabled while the upper gate clocking circuit is enabled. Further, it is assumed that D flip-flop 56 has been reset wherein its $\overline{Q}$ outputs are high. Thus, a high output state is produced at the outputs of inverter gate 50 due to the input thereof being forced to a logic zero by inverter gate 42. The high output state of inverter gate 50 of the upper gate clocking circuit is applied to the set inputs of RS flip-flop stages 16 and 20. However, these two RS flip-flops are unaffected since RS flip-flops 14 and 18 having been placed in a reset state have forced the set inputs of RS flip-flops 16 and 20 to be in a low state. The output of inverter gate 48 is forced low because the Q output of FF5 is low by virtue of it having been reset. Thus flip-flops 14 and 18 remain unaffected. Now, when the D flip-flop 56 is clocked once at time t1 by clock signal 88 going low, the Q outputs of flip-flop 56 go high (waveform 90) while the $\overline{Q}$ outputs 92 go low. This action causes the outputs of inverter gate 48 to go high which sets RS flip-flop stage 14 thereby causing the Q1 output to go to a high state. RS flip-flops 16, 18, and 20 however are not affected at this time because they are in a reset state. So the outputs Q1–Q4 of shift register 10 are now set at a binary digit equal to 1000 in response to the clock pulses occurring at time t1. On the next negative transition of clock pulse 88, at t2, the Q and $\overline{Q}$ outputs of D flip-flop 56 go low and high respectively. This causes the output of inverter gate 50 to go high which, due to the high output state of RS flip-flop stage 14, will cause RS flip-flop 16 to be set thereby changing output Q2 to a high state. RS flip-flop 18 does not change state at this time since the Q output of D flip-flop 56 is low which prevents the flip-flop from being set as the output of inverter gate 48 is forced low. RS flip-flop 20 does not change states at t2 because RS flip-flop 18 remains in its reset state wherein output Q3, waveform 84, remains low. Thus, after t2, in response to two clock pulses, the outputs of shift register 10 are equal to b 1100. Therefore, the digital data stored in RS flip-flop 14 has now been shifted to the right to adjacent following RS flip-flop 16. Similarly, at t3, the Q output of D flip-flop 56 is clocked high which causes the outputs of inverter gate 48 to go high which in combination with the Q outputs of RS flip-flop 16 being high sets RS flip-flop 18 thereby forcing its Q outputs, including Q3 (waveform 84) to go high. Thus, the digital data is shifted to the right into RS flip-flop 18. RS flip-flop 20 remains in its reset state due to the output of inverter gate 50 being forced low by complementary $\overline{Q}$ output of D flip-flop 56 being in a low state. The outputs Q1 through Q4 of shift register 10 are now equal to 1110. Finally, in response to clock pulse 88 clocking D flip-flop 56 at time t4 data is shifted from preceding RS flip-flop 18 into following RS flip-flop 20 as the latter is placed in a set state by the $\overline{Q}$ output of D flip-flop 56 going high. Therefore, at t4, all of the RS flip-flops of shift register 10 have now been placed in a set state in a sequential manner upon the occurrence of each succeeding complimentary clocking pulses occurring at the output of D flip-flop 56 such that the Q1 through Q4 outputs of shift register 10 are now set to be equal to 1111.

Upon all of the Q outputs of the cascaded RS flip-flops becoming high latch gate 34 is forced to switch states such that the inputs to inverter gates 40 and 42 are forced low which disables the upper clock gating circuit including inverter gates 48 and 50 whereby the complementary clocking pulses appearing at the outputs of D flip-flop 56 are inhibited from further affecting the set inputs of RS flip-flops 14, 16, 18 and 20. Simultaneously however, the lower gate clocking circuit including gates 44, 46 are enabled by the outputs of gate 38 being in a high logic state to toggle inverted gates 52 and 54 as the complementary clocking pulses appear at the output of D flip-flop 56. This in turn allows the RS flip-flops 14 through 20 to be reset in sequence starting with RS flip-flop 20 whereby digital data information will be shifted left to the preceding RS flip-flops 18, 16 and then 14. Thus, as shown at time t5, on the occurrence of the next clock pulse 88 going negative the Q outputs of D flip-flop 56 go high causing RS flip-flop 20 to be reset as the reset input thereof go to a high state via the outputs of inverter gates 44 and 52. Therefore, at t5 the outputs of shift register 10, Q1 through Q4, become equal to the binary digit 1110. RS flip-flop 16 is not reset at t5 because its reset input is held low by the $\overline{Q}$ output from RS flip-flop 18. On the next clock pulse occurring at t6, RS flip-flop 18 is reset by the $\overline{Q}$ output of D flip-flop 56 going high that forces a high input via inverter gates 46 and 54 to the reset input of the flip-flop. Hence, the Q3 output, waveform 84, of shift register 10 goes low forcing the output of the shift register to be equal to 1100. RS flip-flop 14 is not affected by the $\overline{Q}$ output of D flip-flop 56 going high as its reset input is forced low by the $\overline{Q}$ output of following stage RS flip-flop 16 being in a low state. In a similar manner, in response to the next two clocking pulses occurring in sequence at times t7 and t8, RS flip-flops 16 and 14 are sequentially reset such that the outputs of shift register 10 are first equal to 1000 and then 0000. Hence, the data has been shifted to the left from the last RS flip-flop 20 into adjacent preceding RS flip-flop 18 and then through preceding RS flip-flop stages flip-flop 16 and 14 upon each succeeding complementary clocking pulses until the initial assumed state is established. Thereafter, the above operation is cyclically repeated in response to sequential clocking pulses whereby the outputs of shift register 10 go from 0000 to 1111 and back to 0000 as long as a clocking pulse is applied to input terminal 12 of D flip-flop 56. Shift register 10 is reset by a high or logic "1" input signal being applied to the MR input terminal. Moreover, as illustrated, selected $\overline{Q}$ outputs of RS flip-flops 14 through 20 are wire "anded" to the input of inverter gate 32 of latch gate 34 via lead 79 to inhibit any transients or extraneous signal from causing shift register 10 to not count in the proper sequence. Hence, shift register 10 is forced to a normal counting sequence of 0000, 1000, 1100, 1110, 1111, 1110, 1100, 1000, and 0000 during its operation.

Thus, what has been described above is a novel shift register using cascaded RS flip-flops in combination with gate circuitry to provide a shift-right shift-left function. The RS flip-flop shift register is compatible with contemporary I2L process technology. The use of RS flip-flops allow a minimum number of logic gates to be utilized for the shift register.

I claim:

1. A shift register, comprising:
   a first RS flip-flop having a plurality of outputs at which appear respective complementary digital output signals, a set input and a reset input;
   a second RS flip-flop having a plurality of outputs at which appear respective complementary digital output signals, a set input and a reset input, said set input of said second RS flip-flop being coupled to a first selected output of said first RS flip flop, a selected one of said outputs of said second RS flip-flop being coupled to said reset input of said first RS flip-flop; and
   control circuit means coupled between selected complementary outputs of said second RS flip-flop and said set and reset inputs of both said first and second RS flip-flop, said control circuit means being responsive both to complementary clock pulses being applied thereto and to the state of said output signals of said second RS flip-flop for enabling digital data stored in said first and second RS flip-flop to be shifted therebetween.

2. The shift register of claim 1 including additional RS flip-flops each having a plurality outputs at which appear respective complementary digital output signals and a set input and a reset input, said additional RS flip-flops being coupled in cascade with said first and second RS flip-flop wherein a selected one of said outputs of each preceding RS flip-flop is coupled to said set input of the adjacent following RS flip-flop and said reset input of each of said preceding RS flip-flop is coupled to a selected output of said adjacent following RS flip-flop.

3. The shift register of claim 2 wherein said control circuit means includes:
   upper gate clocking circuit means coupled to said set inputs of said cascaded RS flip-flops including said first and second RS flip-flop, said upper gate clocking circuit means being responsive to said complementary clock pulses when enabled to cause said digital data stored in a preceding RS flip-flop to be shifted into and stored into an adjacent following RS flip-flop on the occurrence of said complementary clocking pulses;
   lower gate clocking circuit means coupled to said reset inputs of said cascaded RS flip-flop including said first and second RS flip-flop, said lower gate clocking circuit means being responsive to said complementary clock pulses when enabled to cause said digital data stored in a following RS flip-flop to be shifted into and stored in adjacent preceding RS flip-flop on the occurrence of succeeding complementary clock pulses; and
   latch gate circuit means coupled between said selected complementary outputs of said second RS flip-flop at which appear complementary digital output signals and said upper gate clocking means and said lower gate clocking means, said latch gate circuit means being responsive to said complementary output signals appearing at said outputs of said second RS flip-flop being in a first state for enabling said upper gate clocking circuit means and disabling said lower gate clocking circuit means.

4. The shift register of claim 3 wherein said latch gate circuit means is responsive to said complementary digital output signals appearing at said output of said second RS flip-flop being in a second state for disabling said upper gate clocking circuit means and enabling said lower gate clocking circuit means.

5. The shift register of claim 4 including a D flip-flop responsive to a clock pulse applied thereto for producing succeeding complementary clock pulses at respective outputs thereof that are applied to respective inputs of said upper gate clocking circuit means and said lower gate clocking circuit means.

6. The shift register of claim 5 wherein said latch gate circuit means includes:

first and second inverter gates each having an input and an output, said inputs of said first and second inverter gates being coupled respectively to said first and second complementary outputs of said second RS flip-flop; and third and fourth inverter gates each having an input and a plurality of outputs, said inputs of said third and fourth inverter gates being coupled respectively to said outputs of said second and first inverter gates, said plurality of outputs being coupled respectively to said upper and lower gate clocking circuit means.

7. The shift register of claim 6 wherein said upper gate clocking circuit means includes:

first and second inverter gates each having an input and an output, said input of said first inverter gate being coupled both to one of said outputs of said third inverter gate of said latch gate circuit means and to one of said outputs of said D flip-flop at which appears a clock pulse, said input of said second inverter gate being coupled both to one of said outputs of said third inverter gate of said latch gate circuit means and to one of said outputs of said D flip-flop at which appears a clock pulse with said clock pulse that is applied to said first inverter gate being the complement of said clock pulse that is applied to said second inverter gate;

a third inverter gate having an input coupled to said output of said first inverter gate of said upper gate clocking circuit means and a plurality of outputs the first one of which is coupled to a said set input of said first RS flip-flop and other outputs being coupled to respective set inputs alternate ones of said additional RS flip-flops; and a fourth inverter gate having an input coupled to said output of said second inverter gate of said upper gate clocking circuit means and a plurality of outputs a first one of which is coupled to said set input of said second RS flip-flop and other outputs being coupled to respective set inputs alternate ones of said additional RS flip-flops that are not connected to said outputs of said third inverter gate of said upper gate clocking circuit means.

8. The shift register of claim 6 wherein said lower gate clocking circuit means includes:

first and second inverter gates each having an input and an output, said input of said first inverter gate being coupled both to one of said outputs of said fourth inverter gate of said latch gate circuit means and to one of said outputs of said D flip-flop at which appears a clock pulse, said input of said second inverter gate being coupled both to one of said outputs of said fourth inverter gates of said latch gate circuit means and to one of said outputs of said D flip-flop at which appears a complementary clock pulse with respect to said clock pulse applied to said first inverter gate;

a third inverter gate having an input coupled to said output of said first inverter gate of said lower gate clocking circuit means and a plurality of outputs a first one being coupled respectively to said reset input of said first RS flip-flop and other outputs being coupled to respective reset inputs of alternate ones of said additional RS flip-flops; and a fourth inverter gate having an input coupled to said output of said second inverter gate of said lower gate clocking circuit means and a plurality of outputs, a first output being coupled respectively to said reset input of said second RS flip-flop and other outputs being coupled to respective reset inputs of alternate ones of said additional RS flip-flops that are not connected to said outputs of said third inverter gate of said lower gate clocking circuit means.

9. The shift register of claim 8 wherein said upper gate clocking means includes:

first and second inverter gates each having an input and an output, said input of said first inverter gate being coupled both to one of said outputs of said third inverter gate of said latch gate circuit means and to one of said outputs of said D flip-flop at which appears a clock pulse, said input of said second inverter gate being coupled both to one of said outputs of said third inverter gate of said latch gate circuit means and to one of said outputs of said D flip-flop at which appears a clock pulse with said clock pulse that is applied to said first inverter gate being the complement of said clock pulse that is applied to said second inverter gate;

a third inverter gate having an input coupled to said output of said first inverter gate of said upper gate clocking circuit means and a plurality of outputs respectively coupled to a said set input of said first RS flip-flop and respective set inputs of alternate ones of said additional RS flip-flops; and a fourth inverter gate having an input coupled to said output of said second inverter gate of said upper gate clocking circuit means and a plurality of outputs respectively coupled to said set input of said second RS flip-flop and respective set inputs of alternate ones of said additional RS flip-flops that are not connected to said outputs of said third inverter gate of said upper gate clocking circuit means.

10. A shift register, comprising:

a plurality of cascaded RS flip-flops; and gating circuit means coupled between complementary outputs of the last one of said cascaded RS flip-flops and the reset (R) and set (S) inputs of said plurality of RS flip-flops, said gating circuit means being responsive both to succeeding complementary clocking pulses being applied thereto and to the state of said outputs of said last one of said RS flip-flops for enabling digital data stored in a preceding or following RS flip-flop of said plurality of cascaded RS flip-flops to be shifted into an adjacent following or preceding RS flip-flop upon occurrence of said succeeding complementary clock pulses.

11. The shift register of claim 10 wherein a selected output of each preceding RS flip-flop is coupled to the set input of an adjacent following RS flip-flop and a selected output of each following RS flip-flop is coupled to the reset input of an adjacent preceding RS flip-flop.

12. The shift register of claim 11 wherein said gating circuit means includes:

a latch circuit coupled to said complementary outputs of said last RS flip-flop at which are produced complementary output signals, said latch circuit having a plurality of respective outputs at which complementary output signals are produced;

upper gate circuit means coupled to respective ones of said plurality of outputs of said latch circuit at which a first one of said complementary output signals are produced, said upper gate circuit means being responsive to said succeeding complementary clocking pulses for enabling digital data information to be shifted from a preceding RS flip-flop into a following RS flip-flop when said upper gate circuit means is enabled by said latch circuit; and lower gate circuit means coupled to respective ones of said plurality of outputs of said latch circuit at which a second one of said outputs signals are produced, said output signals being the complement of said output signals applied to said upper gate circuit means, said lower gate circuit means being responsive to said succeeding complementary clocking pulses for enabling digital data information to be shifted from a following RS flip-flop into a preceding RS flip-flop when said lower gate circuit means is enabled by said latch circuit.

13. The shift register of claim 12 wherein said upper gate circuit means includes:

first and second inverter gates each having an input and an output, said inputs being coupled to said outputs of said latch circuit at which are produced said first complementary output signals and receiving said succeeding complementary clocking pulses respectively;

a third inverter gate having an input and a plurality of outputs, said input being coupled to said output of said first inverter gate, said outputs being coupled respectively to said set inputs of alternate ones of said plurality of cascaded RS flip-flops; and a fourth inverter gate having an input and a plurality of outputs, said input being coupled to said output of said second inverter gate, said plurality of outputs being coupled respectively to said set inputs of alternate ones of said plurality of RS flip-flops that are not coupled to said plurality of outputs of said third inverter gate.

14. The shift register of claim 12 wherein said lower gate circuit means includes:

first and second inverter gates each having an input and an output, said inputs being coupled to said outputs of said latch circuit at which are produced said second complementary output signals and receiving said succeeding complementary clocking pulses respectively;

a third inverter gate having an input and a plurality of outputs, said input being coupled to said output of said first inverter gate, said outputs being coupled respectively to said reset inputs of alternate ones of said RS flip-flops; and a fourth inverter gate having an input and a plurality of outputs, said input being coupled to said output of said second inverter gate, said outputs being coupled respectively to said reset inputs of alternate ones of said plurality of RS flip-flop that are not coupled to said plurality of outputs of said third inverter gate.

15. The shift register of claim 14 wherein said upper gate circuit means includes: inverter gate of said upper gate clocking circuit means.

first and second inverter gates each having an input and an output, said inputs being coupled to said outputs of said latch circuit at which are produced said first complementary output signals and receiving said succeeding complementary clocking pulses respectively;

a third inverter gate having an input and a plurality of outputs, said input being coupled to said output of said first inverter gate, said outputs being coupled respectively to said set inputs of alternate ones of said plurality of cascaded RS flip-flops; and a fourth inverter gate having an input and a plurality of outputs, said input being coupled to said output of said second inverter gate, said plurality of outputs being coupled respectively to said set inputs of alternate ones of said plurality of RS flip-flops that are not coupled to said plurality of outputs of said third inverter gate.

* * * * *